United States Patent
Wuu

(10) Patent No.: US 6,194,258 B1
(45) Date of Patent: Feb. 27, 2001

(54) METHOD OF FORMING AN IMAGE SENSOR CELL AND A CMOS LOGIC CIRCUIT DEVICE

(75) Inventor: Shou-Gwo Wuu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/483,935

(22) Filed: Jan. 18, 2000

(51) Int. Cl.$^7$ ................................. H01L 21/8238
(52) U.S. Cl. .................. 438/200; 438/275; 438/279; 438/210; 438/229
(58) Field of Search ....................... 438/200, 210, 438/224, 228, 229, 230, 275, 279, 649, 651, 683

(56) References Cited

U.S. PATENT DOCUMENTS

| 5,859,450 | | 1/1999 | Clark et al. ........................ 257/233 |
| 5,863,820 | | 1/1999 | Huang ................................ 438/241 |
| 6,023,081 | * | 2/2000 | Drowley et al. .................... 257/292 |
| 6,040,592 | * | 3/2000 | McDaniel et al. .................. 257/292 |
| 6,040,593 | * | 3/2000 | Park ................................... 257/292 |
| 6,137,127 | * | 2/2000 | Merrill ............................... 257/292 |

* cited by examiner

*Primary Examiner*—Charles Bowers
*Assistant Examiner*—Jack Chen
(74) *Attorney, Agent, or Firm*—George O. Saile; Stephen B. Ackerman

(57) ABSTRACT

A process for integrating the formation of salicided, CMOS logic devices, for a CMOS logic circuit region, and of a non-salicided, photodiode element, for a image sensor cell region, has been developed. The process features the selective formation of a thin silicon oxide layer on the top surface of the photodiode element, in the image sensor cell region of a semiconductor chip. The thin silicon oxide layer prevents formation of metal silicide on the photodiode element, during the procedure used to form the desired metal silicide layer on the CMOS logic devices, thus allowing low dark current generation, and a high signal to noise ratio, to be obtained via the non-salicided, photodiode element. A thick organic layer, is used to protect the thin silicon oxide layer, located on the photodiode element, during the procedure used to remove regions of the thin silicon oxide layer from the surfaces of elements to be subsequently overlaid with metal silicide.

18 Claims, 4 Drawing Sheets

METHOD OF FORMING AN IMAGE SENSOR CELL AND A CMOS LOGIC CIRCUIT DEVICE

BACKGROUND OF THE INVENTION

(1) Field of the Invention

The present invention relates to methods used to fabricate semiconductor devices, and more specifically to a process used to integrate the fabrication of an image sensor cell, and of CMOS logic devices, featuring a non-salicided photodiode element.

(2) Description of Prior Art

Image sensor cells are usually comprised of active image sensing elements, such as photodiodes, in addition to adjacent transistor structures, such as transfer gate transistors, and reset transistors. These transistor structures, as well as additional devices used for the control and signal circuits in the peripheral regions of the image sensor cell, or used for peripheral logic circuits, are comprised with complimentary metal oxide semiconductor, (CMOS), devices. Therefore to reduce process cost and complexity, the image sensor cell has also been fabricated using the same CMOS process sequences used for the peripheral CMOS logic circuits This approach however can influence the quality of the photodiode element, of the image sensor cell, if the photodiode element is subjected to traditional CMOS process sequences. For example if a metal silicide layer is formed on the surface of the photodiode element, during the formation of Self-ALigned metal silICIDE, (Salicide), on the gate structure, as well as on the source/drain region of the CMOS logic circuits, unwanted leakages, in the form of dark current generation, as well as degraded signal to noise, (S/N), ratios, of the image sensor cell, can result.

This invention will describe a process sequence used to form salicide layers on all silicon or polysilicon surfaces of deep submicron CMOS logic devices, (where deep submicron refers to CMOS devices fabricated with channel lengths less than 0.25 $\mu$m), in addition to forming salicide on the top surface of a polysilicon gate structure, located in the image sensor cell region, however avoiding salicide formation on the surface of the photodiode element. This selective salicide formation is accomplished without the use of an additional photolithographic masking procedure, using a thin silicon oxide layer to protect the surface of the photodiode element during the salicide formation procedure. A thick organic layer, applied after removal of the thin silicon oxide layer from regions of CMOS logic devices, is etched back allowing only the top surface of a gate structure, located in the image sensor region, to experience the salicide process. This novel process sequence allows the image sensor cell to be formed simultaneously with the high performance logic devices, featuring the desired low dark current generation, and high S/N ratios, as a result of protecting the photodiode element from salicide processing. Prior art, such as Clark et al, in U.S. Pat. No. 5,859,450, describe a process for forming an image sensor cell, but do not use the process sequence described in the present invention to protect the photodiode element from salicide formation. Huang, in U.S. Pat. No. 5,863,820, does describe a fabrication sequence for forming salicide only on elements of logic regions, while protecting regions of memory devices from the same salicide process. However this prior art does not teach the fabrication sequence, detailed in the present invention, in which a thin silicon oxide layer, and a thick organic layer, are patterned to allow salicide formation only on the top surface of a gate structure of an image sensor cell, while protecting the photodiode element of this cell from the same salicide formation procedure.

SUMMARY OF THE INVENTION

It is an object of this invention to integrate the fabrication of an image sensor cell, and logic devices, using a deep submicron CMOS process.

It is another object of this invention to form salicide layers on the polysilicon gate structure, and on the source/drain region, of the logic devices, while the surface of the photodiode element of the image sensor cell remains non-salicided.

It is yet another object of this invention to protect the surface of the photodiode element from the salicide formation process, via use of a thin silicon oxide layer, located overlying the surface of the photodiode element.

It is still yet another object of this invention to use an etched back, thick organic layer, on the thin silicon oxide layer, in a region overlying the photodiode element, allowing the selective removal of the thin silicon oxide layer from the top surface of a polysilicon gate structure, in the image sensor cell, prior to the salicide formation.

In accordance with the present invention a fabrication process for integrating an image sensor cell, and CMOS logic devices, featuring salicided CMOS logic device elements, and a non-salicided photodiode element, of the image sensor cell, has been developed. After formation of polysilicon gate structures, on an underlying gate insulator layer, for both logic and image sensor cell regions, N type, lightly doped, source/drain regions are formed in an area of a P well region, not covered by the polysilicon gate structures. After formation of silicon nitride spacers, on the sides of the polysilicon gate structures, a heavily doped, N type ion implantation procedure is used to create heavily doped source/drain regions, for both CMOS logic devices and for the image sensor cell, in addition to forming the N/P well, photodiode element, for the image sensor cell. A thin silicon oxide layer is deposited, then removed from the logic device region. A thick organic layer is applied, then etched back to expose the thin silicon oxide layer, located on the top surface of the polysilicon gate structure, in the image sensor cell region. After removal of the exposed, thin silicon oxide layer, the thick organic layer is removed, leaving regions of the thin silicon oxide layer only on the surface of the photodiode element, and on the surface of the source/drain regions, of the image sensor cell. Metal silicide is then formed on all exposed silicon surfaces, including the heavily doped source/drain region, and polysilicon gate structure, of the logic device region, and on the polysilicon gate structure of the image sensor cell, while the surface of the photodiode element, and of the heavily doped source/drain region, of the image sensor cell, remain non-salicided. An interlevel insulator layer is deposited, followed by contact openings exposing the salicided polysilicon gate structure, and the salicided heavily doped, source/drain region, of the logic device region, as well as exposing a non-salicide, heavily doped source drain region, located in the image sensor cell. Metal contact structures are then formed in the contact hole openings.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
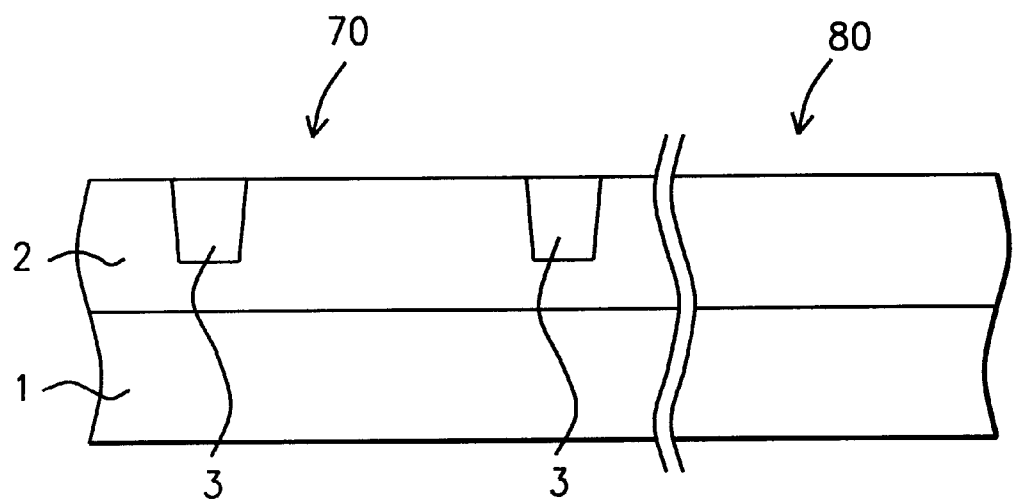
FIGS. 1–8, which schematically, in cross-sectional style, describe the key stages of an integrated fabrication process, used to simultaneously form salicided CMOS devices, for CMOS logic circuits, and a non-salicided photodiode element, of an image sensor cell.

The process for integrating the fabrication of salicided CMOS devices, for CMOS logic circuits, with a non-salicided photodiode element of an image sensor cell, will now be described in detail. A P type semiconductor substrate 1, comprised of single crystalline silicon, with a <100> crystallographic orientation, is used and schematically shown in FIG. 1. Region 70, will be used for fabrication of the pixel, or image sensor cell, while region 80, will be used for fabrication of complimentary metal oxide semiconductor, (CMOS), logic circuits. P well region 2, is next formed in a top portion of semiconductor substrate 1, via ion implantation of boron, at an energy between about 140 to 250 KeV, and at a dose between about 2.5E12 to 3.0E13 atoms/cm$^2$. The concentration of P type dopant in P well region 2, is greater than the concentration of P type dopant in semiconductor substrate 1. Isolation regions 3, either silicon oxide, filled shallow trenches, or silicon dioxide, field oxide regions, (FOX), are formed to electrically separate image sensor cell region 70, from CMOS logic circuit region 80, as well as electrically isolating the photodiode element, and the transfer, or reset gate structures, both located in the image sensor cell region 70. This is schematically shown in FIG. 1.

Figure 2:
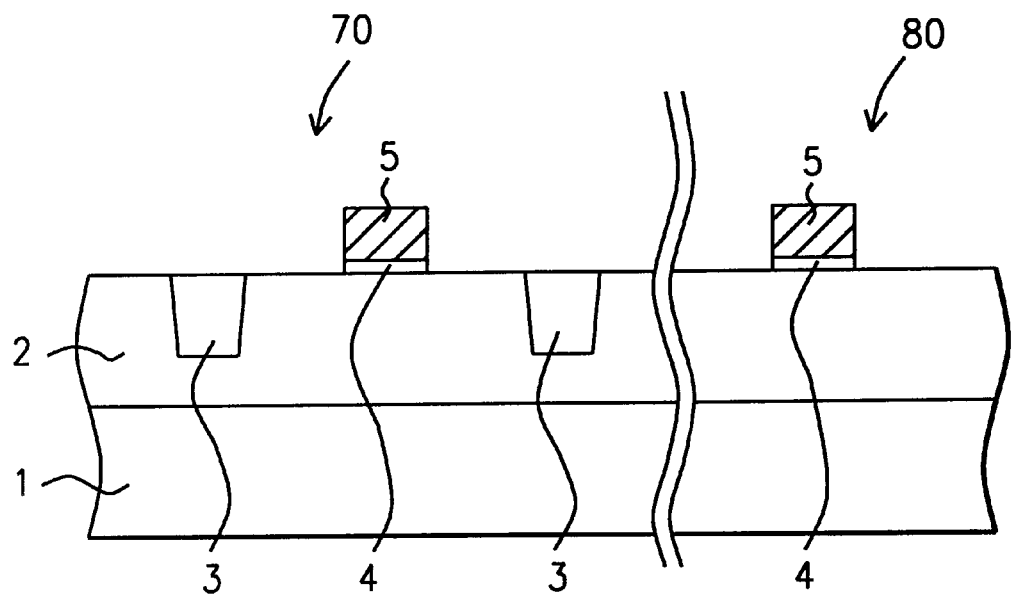

The formation of polysilicon gate structures for both the image sensor cell and for the CMOS logic circuits, is next addressed and shown schematically in FIG. 2. Gate insulator layer 4, comprised of silicon dioxide, is thermally grown to a thickness between about 40 to 55 Angstroms. A polysilicon layer is next deposited via low pressure chemical vapor deposition, (LPCVD), procedures to a thickness between about 1500 to 3000 Angstroms. The polysilicon layer can be doped in situ, during deposition, via the addition of arsine, or phosphine, to a silane ambient, or the polysilicon layer can be deposited intrinsically then doped via implantation of arsenic or phosphorous ions. Conventional photolithographic and reactive ion etching, (RIE), procedures, using $Cl_2$ or $SF_6$ as an etchant, are used to etch polysilicon, defining polysilicon gate structures 5, on gate insulator layer 4, located in image sensor cell region 70, and in CMOS logic circuit region 80. The photoresist shapes used to define polysilicon gate structures 5, are removed via plasma oxygen ashing and careful wet cleans, with the wet clean cycle removing the regions of gate insulator layer 4, not covered by polysilicon gate structures 5.

Figure 3:
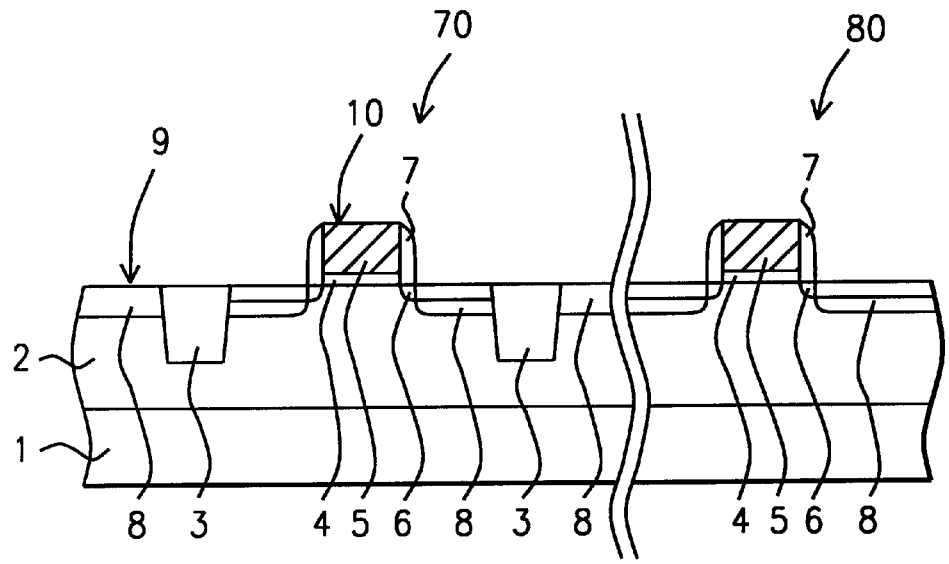

Lightly doped, N type source/drain regions 6, are next formed in areas of P well region 2, not covered by polysilicon gate structures 5, via implantation of arsenic or phosphorous ions, at an energy between about 35 to 50 KeV, at a dose between about 1E14 to 6E15 atoms/cm$^2$. A silicon nitride layer is next deposited via LPCVD or via plasma enhanced chemical vapor deposition, (PECVD), procedures, at a thickness between about 800 to 2000 Angstroms, followed by a blanket, anisotropic RIE procedure, using $CF_4$ as an etchant, creating silicon nitride spacers 7, on the sides of polysilicon gate structures 5. This is schematically shown in FIG. 3. Another implantation procedure is then performed, using arsenic or phosphorous ions at an energy between about 35 to 50 KeV, at a dose between about 1E14 to 6E15 atoms/cm$^2$, to form heavily doped, N type source/drain regions 8, in areas of P well region 2, not covered by polysilicon gate structure 5, or by silicon nitride spacers 7.

This ion implantation procedure also results in the formation of photodiode element 9, in image sensor cell region 70, with photodiode element 9, comprised of the heavily doped N type region 8, in P well region 2. The polysilicon gate structure 10, in image sensor cell region 70, will function as a transfer gate transistor, or as a reset transistor, for the image sensor cell. This is schematically shown in FIG. 3.

Figure 4:
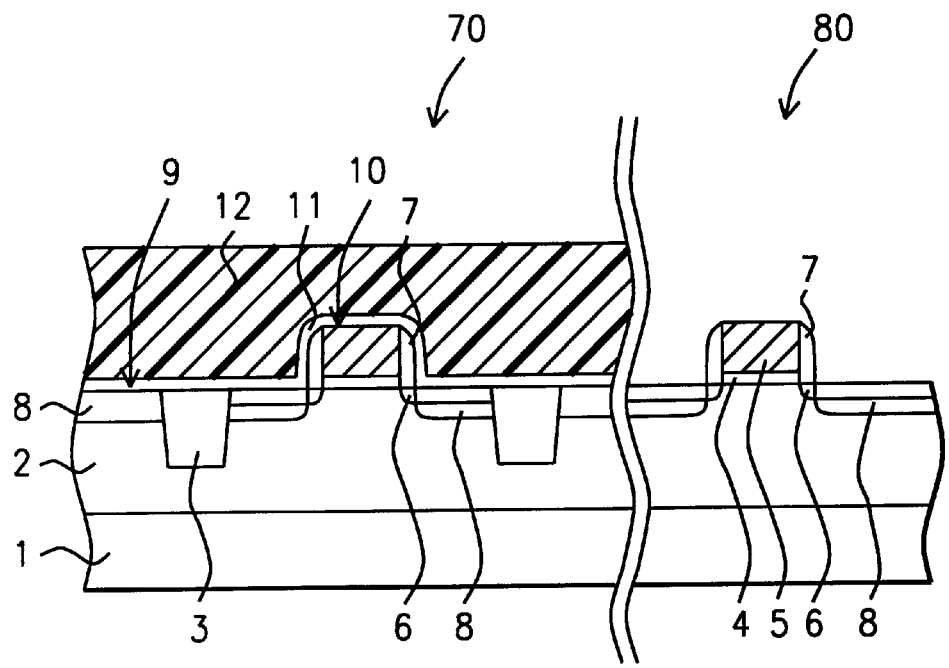
Figure 5:
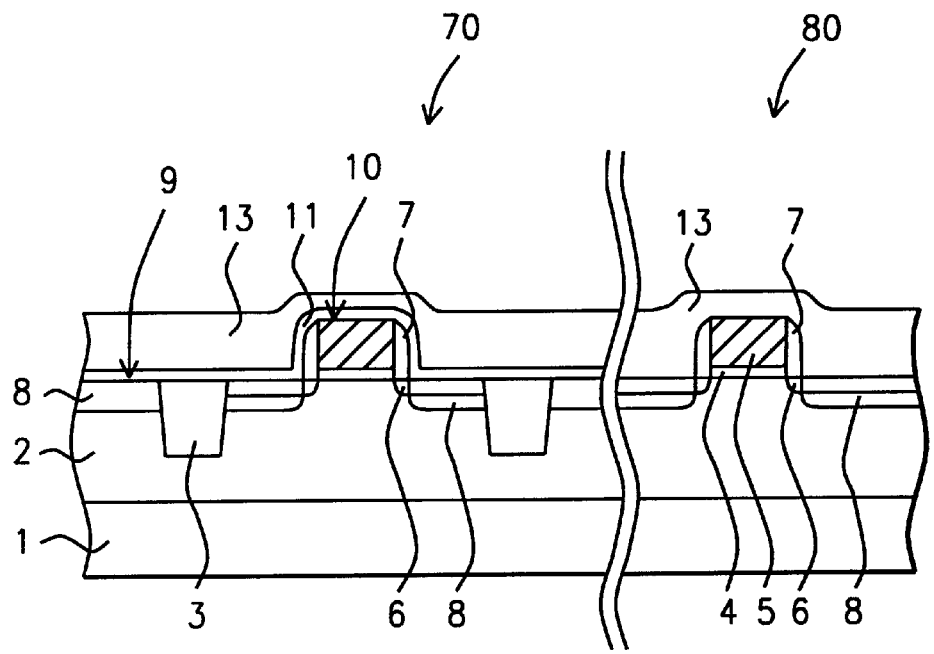

The process sequence used to form salicide layers on CMOS logic devices, while preventing salicide formation on the surface of photodiode element 9, is now described. A thin silicon oxide layer 11, obtained using rapid process oxidation, (RPO), or obtained via LPCVD or PECVD procedures, at a thickness between about 300 to 400 Angstroms, is formed and shown schematically in FIG. 4. Photoresist shape 12, is next defined and used as a mask to remove thin silicon oxide layer 11, from all regions of logic circuit region 80. This is accomplished using a buffered hydrofluoric acid solution. After removal of photoresist shape 12, via plasma oxygen ashing and careful wet cleans, an organic layer 13, such as a bottom anti-reflective coating, (BARC), comprised of I line photoresist, is applied, at a thickness between about 1000 to 3000 Angstroms. Organic layer 13, shown schematically in FIG. 5, overlays thin silicon oxide layer 11, in image sensor cell 70. An important requirement of organic layer 13, is to fill the spaces between polysilicon gate structures with a thick organic layer, while a thinner potion of the same organic layer resides on the top surface of polysilicon gate structure 10. Therefore if desired other materials, such as a spin on glass, (SOG), can be used in place of the BARC layer, to satisfy these requirements.

Figure 6:
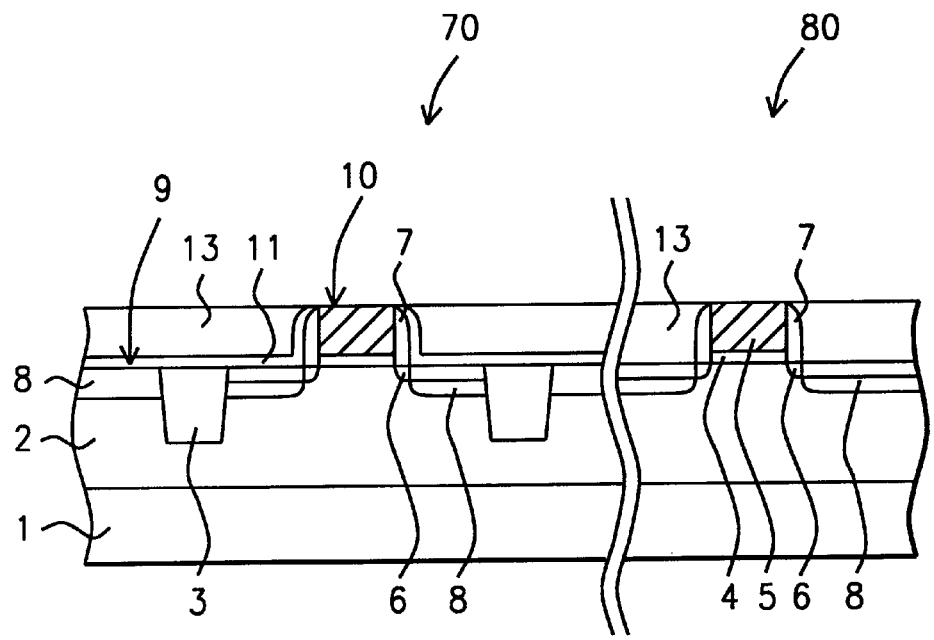

A critical etch back procedure is next performed, via RIE procedures, using oxygen as an etchant, with the etch back procedure terminated at the point in which the portion of thin silicon oxide layer 11, residing on the top surface of polysilicon gate structure 10, is exposed. At this stage the exposed portion of thin silicon oxide layer 11, is removed via a buffered hydrofluoric acid procedure, exposing the top surface of polysilicon gate structure 10, in image sensor cell region 70. The etch back procedure also exposes the top surface of the polysilicon gate structure in CMOS logic region 80. If desired, removal of the exposed portion of thin silicon oxide layer from the top surface of polysilicon gate structure 10, can be accomplished via a RIE procedure, using $CHF_3$ as an etchant. The result of these process steps are schematically shown in FIG. 6.

Figure 7:
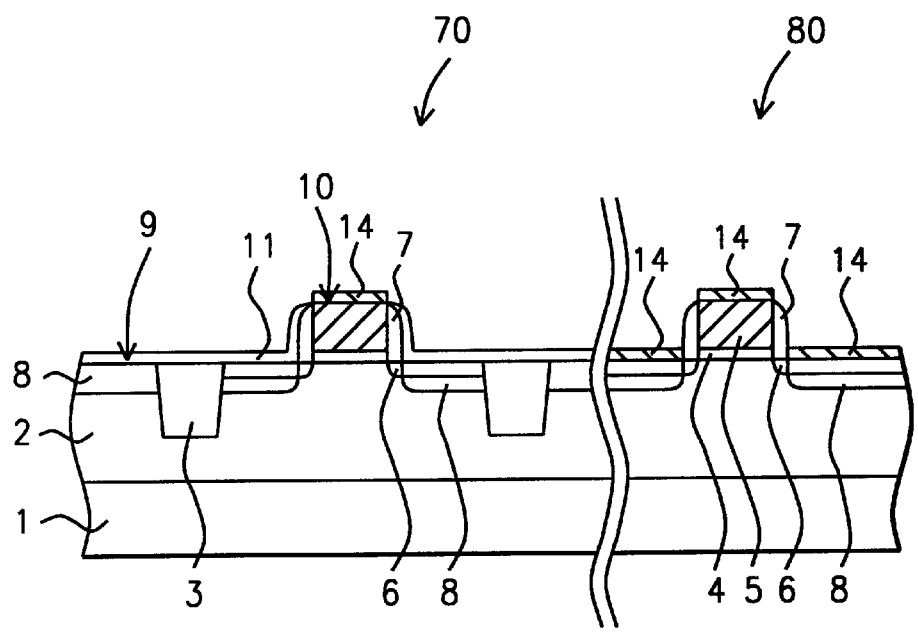

Organic layer 13, is next removed via plasma oxygen ashing procedures, resulting in the exposure of the top surface of polysilicon gate structure 10, located in image sensor cell region 70, as well as exposure of the top surface of the polysilicon gate structure and of the heavily doped source/drain region, in CMOS logic circuit region 80. However as intended, thin silicon oxide layer 11, remains overlaying the top surface of photodiode element 9, as well as overlaying heavily doped, N type source/drain region 8, in image sensor cell region 70. A metal layer such as either titanium, cobalt, or nickel, is next deposited via RF sputtering, or plasma vapor deposition procedures, to a thickness between about 200 to 500 Angstroms. An anneal, cycle, performed using conventional furnace procedures, or using a rapid thermal anneal procedures, at a temperature between about 650 to 800° C., is employed to form metal silicide layer 14, such as either titanium silicide, cobalt silicide, or nickel silicide, on the exposed polysilicon or silicon surfaces, leaving unreacted metal on the sides of silicon nitride spacers 7, and of upmost importance leaving unreacted metal on the surface of thin silicon oxide layer 11, which in turn overlays the top surface of photodiode element 9. The unreacted metal is then removed using a solution comprised of $H_2SO_4$—$H_2O_2$—$NH_4OH$, resulting in the desired situation of the performance enhancing, salicided elements in CMOS logic circuit region 80, and the non-salicided photodiode element, in image sensor cell region 70, which results in less dark current generation, and a larger signal to noise ratio, than counterparts fabricated with salicided photodiode elements. The result of these process steps is schematically shown in FIG. 7.

Figure 8:
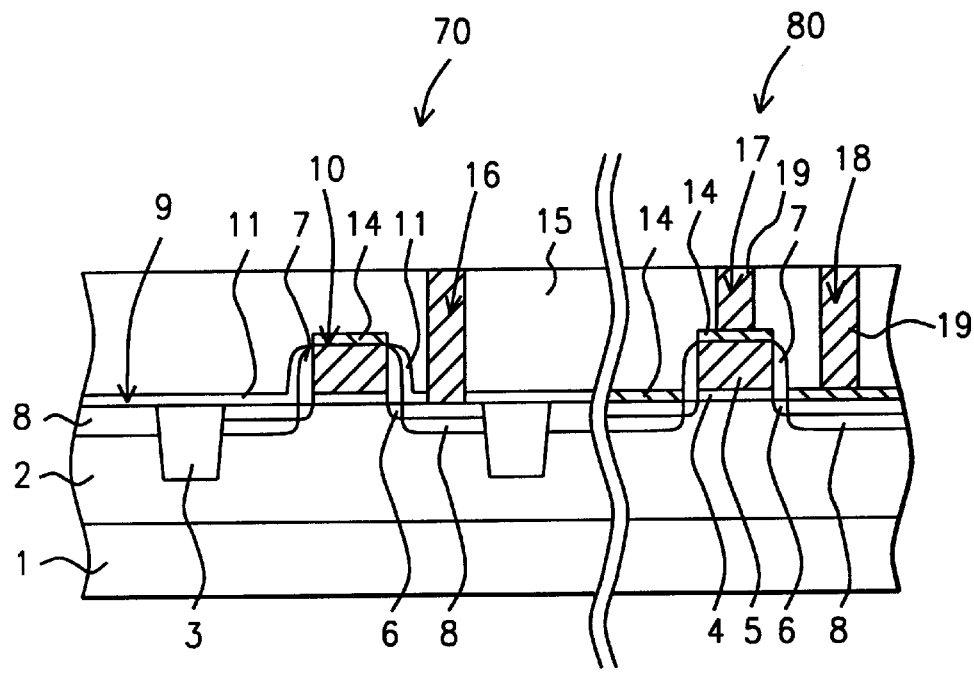

An interlevel dielectric, (ILD), layer 15, shown schematically in FIG. 8, comprised of silicon oxide, or borophosphosilicate glass, (BPSG), is next deposited, via LPCVD or PECVD procedures, to a thickness between about 8000 to 13000 Angstroms. A chemical mechanical polishing, (CMP), procedure is used for planarization purposes, creating a smooth top surface topography for ILD layer 15. Conventional photolithographic and RIE procedures, using $CHF_3$ as an etchant, are used to open contact hole 16, in ILD layer 15, exposing a portion of the top surface of heavily doped, N type source/drain region 8, in image sensor cell region 70. The same photolithographic and RIE procedure also opens contact holes 17, and 18, in ILD layer 15, exposing a portion of the top surface of metal silicide layer 14, located overlaying the polysilicon gate structure, and the heavily doped, N type, source/drain region, located in CMOS logic circuit region 80. After removal of the photoresist shape used for definition of contact holes 16, 17, and 18, via plasma oxygen ashing and careful wet cleans, a metal layer such as tungsten, aluminum, or copper, is deposited via RF sputtering, or via plasma vapor deposition procedures, to a thickness between about 3500 to 5000 Angstroms, completely filling contact holes 16, 17, and 18. Removal of metal, form the top surface of ILD layer 15, is accomplished using either a CMP procedure, or via a selective RIE procedure, using $Cl_2$ or $SF_6$ as an etchant, creating metal contact plugs 19, in contact holes 16, 17, and 18. The result of these procedures is schematically shown in FIG. 8. The ability to prevent salicide formation on the surface of the photodiode element, allows the dark generation, and signal to noise ratio, of the image sensor cell to be optimized, while this integrated process sequence allows the performance of the CMOS logic devices to be maximized with the inclusion of salicided CMOS devices, in the CMOS logic circuit region.

While this invention has been particularly shown and described with reference to the preferred embodiments thereof, it will be understood by those skilled in the art that various changes in form and details may be made without departing from the spirit and scope of this invention.

What is claimed is:

1. A method of forming an image sensor cell, and a CMOS logic circuit region, on a semiconductor substrate, comprising the steps of:

forming a P well region, in a top portion of said semiconductor substrate;

forming a first gate structure, on a gate insulator layer, on a first region of said semiconductor substrate, to be used for said image sensor cell, and simultaneously forming a second gate structure, on said gate insulator layer, on a second region of said semiconductor substrate, to be used for said CMOS logic circuit region;

simultaneously forming: a first source/drain region in an area of said semiconductor substrate not covered by said first gate structure, in said first region of said semiconductor substrate; a second source/drain region in an area of said semiconductor substrate not covered by said second gate structure, in said second region of said semiconductor substrate; and a photodiode element, comprised of an N type region, in a portion of said P well region, located in said first region of said semiconductor substrate; depositing a thin silicon oxide layer; removing said thin silicon oxide layer from said CMOS logic circuit region; applying a thick organic layer; etching portions of said thick organic layer to expose said first gate structure and said second gate structure; removing an unetched portion of the thick organic layer; and forming a metal silicide layer on a top surface of said second gate structure, and on said second source/drain region, in said second region of said semiconductor substrate, while simultaneously forming a metal silicide layer on a top surface of said first gate structure, in said first region of said semiconductor substrate.

2. The method of claim 1, wherein said P well region is formed via implantation of boron ions, at an energy between about 140 to 250 KeV, at a dose between about 2.5E12 to 3.0E13 atoms/$cm^2$.

3. The method of claim 1, wherein said gate insulator layer is a silicon dioxide layer, obtained via thermal oxidation procedures, at a thickness between about 40 to 55 Angstroms.

4. The method of claim 1, wherein said first gate structure, and said second gate structure, are defined from a polysilicon layer, which is obtained via LPCVD procedures at a thickness between about 1500 to 3000 Angstroms, and either doped in situ, during deposition via an addition of arsine, or phosphine, to a silane ambient, or deposited intrinsically then doped via implantation of arsenic, or phosphorous ions.

5. The method of claim 1, wherein said N type region, of said photodiode element, is formed via an ion implantation procedure, using arsenic, or phosphorous ions, at an energy between about 35 to 50 KeV, at a dose between about 1E14 to 6E15 atoms/$cm^2$.

6. The method of claim 1, wherein said metal silicide layer is either a titanium silicide layer, a cobalt silicide layer, or a nickel silicide layer.

7. A method of simultaneously forming Self-Aligned metal silICIDE, (salicided), CMOS devices, in a CMOS logic circuit region of a semiconductor substrate, and a non-salicided photodiode element, in an image sensor cell region of said semiconductor substrate, comprising the steps of performing a first ion implantation procedure to create a P well region, in a top portion of said semiconductor substrate;

growing a silicon dioxide gate insulator layer on said semiconductor substrate;

forming a first polysilicon gate structure, on said silicon dioxide gate insulator layer, in said image sensor cell region, and forming a second polysilicon gate structure, on said silicon dioxide gate insulator layer, in said CMOS logic circuit region;

performing a second ion implantation procedure to create: a first heavily doped, N type source/drain region, in an area of said CMOS logic circuit region not covered by said second polysilicon gate structure; a second heavily doped, N type source/drain region, in a first area of said image sensor cell region not covered by said first polysilicon gate structure; and an N type region, in a second area of said image sensor cell region, resulting in said photodiode element comprised of said N type region, in said P well region;

depositing a thin silicon oxide layer;

removing said thin silicon oxide layer from said CMOS logic circuit region;

applying a thick organic layer;

performing an etch back procedure of said thick organic layer to expose a region of said thin silicon oxide layer located on a top surface of said first polysilicon gate structure, leaving said thick organic layer overlaying said thin silicon oxide layer, in regions in which said thin silicon oxide layer overlays a top surface of said photodiode element, and in regions in which said thin silicon oxide layer overlays said second heavily doped, N type source/drain regions;

removing said thin silicon oxide layer from the top surface of said first polysilicon gate structure;

removing said thick organic layer;

depositing a metal layer;

performing an anneal procedure to form a metal silicide layer on a top surface of said second polysilicon gate structure, on a top surface of said first heavily doped, N type source/drain regions, and on the top surface of said first polysilicon gate structure, while said metal layer remains unreacted on regions in which said metal layer overlays said thin silicon oxide layer; and removing unreacted regions of said metal layer, from said thin silicon oxide layer, resulting in said salicided, CMOS devices, in said CMOS logic circuit region, and said non-salicided, photodiode element, in said image sensor cell region.

8. The method of claim 7, wherein said first ion implantation procedure, used to form said P well region, is performed using boron ions, at an energy between about 140 to 250 KeV, at a dose between about 2.5E12 to 3.0E13 atoms/cm$^2$.

9. The method of claim 7, wherein said silicon dioxide gate insulator layer is obtained via thermal oxidation procedures, at a thickness between about 40 to 55 Angstroms.

10. The method of claim 7, wherein said first polysilicon gate structure, and said second polysilicon gate structure, are defined from a polysilicon layer which is obtained via LPCVD procedures at a thickness between about 1500 to 3000 Angstroms, and doped in situ, during deposition via a addition of arsine, or phosphine, to a silane ambient, or deposited intrinsically then doped via implantation of arsenic, or phosphorous ions.

11. The method of claim 7, wherein said second ion implantation procedure, used to form said N type region of said photodiode element, is performed using arsenic or phosphorous ions, at an energy between about 35 to 50 KeV, at a dose between about 1E14 to 6E15 atoms/cm$^2$.

12. The method of claim 7, wherein said thin silicon oxide layer is obtained via either RPO, (rapid thermal oxidation), LPCVD, or PECVD procedures, to a thickness between about 300 to 400 Angstroms.

13. The method of claim 7, wherein said thick organic layer is a bottom anti-reflective layer, (BARC), layer, comprised of an I line photoresist layer, applied to a thickness between about 1000 to 3000 Angstroms.

14. The method of claim 7, wherein said etch back procedure, applied to said thick organic layer, is performed via a RIE procedure, using oxygen as an etchant.

15. The method of claim 7, wherein said thin silicon oxide layer is removed from the top surface of said first polysilicon gate structure via use of a buffered hydrofluoric acid solution, or via a selective RIE procedure, using CHF$_3$ as an etchant.

16. The method of claim 7, wherein said thick organic layer is removed via plasma oxygen ashing procedures.

17. The method of claim 7, wherein said metal layer is either a titanium, cobalt, or nickel layer, obtained via RF sputtering, or via plasma vapor deposition, (PVD), procedures, at a thickness between about 200 to 500 Angstroms.

18. The method of claim 7, wherein said anneal procedure, used to form said metal silicide layer, is performed via conventional furnace anneal procedures, or via rapid thermal anneal, (RTA), procedures, at a temperature between about 650 to 800° C.

* * * * *